United States Patent
Schmitt et al.

(10) Patent No.: US 11,519,751 B2
(45) Date of Patent: Dec. 6, 2022

(54) METHOD OF MONITORING A MAGNETIC SENSOR

(71) Applicant: Analog Devices International Unlimited Company, County Limerick (IE)

(72) Inventors: Jochen Schmitt, Biedenkopf (DE); Peter James Tonge, Newbury (GB); Monsoon Dutt, London (GB); Jan Kubik, Limerick (IE); Enno Lage, Kiel (DE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/318,792

(22) Filed: May 12, 2021

(65) Prior Publication Data

US 2021/0372821 A1 Dec. 2, 2021

Related U.S. Application Data

(60) Provisional application No. 63/032,118, filed on May 29, 2020.

(51) Int. Cl.
*G01D 5/16* (2006.01)
*G01D 18/00* (2006.01)

(52) U.S. Cl.
CPC .............. *G01D 5/16* (2013.01); *G01D 18/00* (2013.01)

(58) Field of Classification Search
CPC . G01D 2205/26; G01D 5/145; G01R 33/0005
See application file for complete search history.

(56) References Cited

U.S. PATENT DOCUMENTS

| | | | |
|---|---|---|---|
| 9,518,840 B2 | 12/2016 | Bogos et al. | |
| 10,228,267 B2 | 3/2019 | Mattheis et al. | |
| 2013/0278250 A1* | 10/2013 | Raberg | G01R 33/098 324/252 |
| 2015/0108972 A1* | 4/2015 | Zimmer | G11B 5/3909 324/252 |

(Continued)

FOREIGN PATENT DOCUMENTS

| | | |
|---|---|---|
| DE | 102018222879 A1 | 6/2019 |
| EP | 1149300 B1 | 4/2003 |

(Continued)

OTHER PUBLICATIONS

Diegel, et al., "A New Four Bit Magnetic Domain Wall Based Multiturn Counter", IEEE Transactions on Magnetics, vol. 45, No. 10, Oct. 2009.

(Continued)

*Primary Examiner* — Alvaro E Fortich
(74) *Attorney, Agent, or Firm* — Knobbe, Martens, Olson & Bear LLP

(57) ABSTRACT

The present disclosure provides a method of monitoring the magnetic field in which a magnetic sensor is operating in to ensure that the sensor is operating within its defined magnetic window. For example, the method uses the sensor output of either a multi-turn sensor, or some other magnetoresistive sensor that is being used in conjunction with the multi-turn sensor, for example, a magnetic single turn sensor or a second multi-turn sensor, to monitor the operating magnetic field.

20 Claims, 6 Drawing Sheets

(56) References Cited

U.S. PATENT DOCUMENTS

| | | | |
|---|---|---|---|
| 2015/0377646 A1* | 12/2015 | Meyer | G01D 5/14 324/207.25 |
| 2017/0261345 A1 | 9/2017 | Schmitt | |
| 2017/0261546 A1* | 9/2017 | Eagen | G01D 5/145 |
| 2018/0164387 A1* | 6/2018 | Raberg | G01R 33/098 |
| 2018/0216965 A1* | 8/2018 | Richard | G01D 5/2448 |
| 2018/0037251 A1 | 12/2018 | Mattheis et al. | |
| 2018/0356252 A1 | 12/2018 | Diegel et al. | |
| 2019/0293455 A1 | 9/2019 | Tonge et al. | |
| 2019/0323819 A1 | 10/2019 | Zimmer et al. | |
| 2019/0383643 A1 | 12/2019 | Schmitt et al. | |

FOREIGN PATENT DOCUMENTS

| | | |
|---|---|---|
| JP | 6420665 B2 | 11/2018 |
| JP | 2019-502134 A | 1/2019 |
| WO | WO 2018/050156 A1 | 3/2018 |
| WO | WO 2019/001629 A1 | 1/2019 |

OTHER PUBLICATIONS

Extended European Search Report in Application No. 21176480.8, dated Oct. 19, 2021.

Borie et al., "Reliable magnetic domain wall propagation in cross structures for advanced multi-turn sensor devices" (2018).

Weiss et al., "Advanced giant magnetoresistance technology for measurement applications", Measurement Science and Technology, 24:1-17 (2013).

\* cited by examiner

METHOD OF MONITORING A MAGNETIC SENSOR

INCORPORATION BY REFERENCE TO ANY PRIORITY APPLICATIONS

This application claims the benefit of priority of U.S. Provisional Application No. 63/032,118 filed May 29, 2020, the content of which is hereby incorporated by reference herein in its entirety. Any and all applications for which a foreign or domestic priority claim is identified in the Application Data Sheet as filed with the present application are hereby incorporated by reference under 37 CFR 1.57.

FIELD OF DISCLOSURE

The present disclosure relates to magnetic sensors such as magnetic multi-turn sensors. In particular, the present disclosure relates to a method of monitoring the magnetic field in which a magnetic multi-turn sensor is operating.

BACKGROUND

Magnetic multi-turn sensors are commonly used in applications where there is a need to monitor the number of times a device has been turned. An example is a steering wheel in a vehicle. Magnetic multi-turn sensors typically include magnetoresistive elements that are sensitive to an applied external magnetic field. The resistance of the magnetoresistive elements can be changed by rotating a magnetic field within the vicinity of the sensor. Variations in the resistance of the magnetoresistive elements will be tracked to determine the number of turns in the magnetic fields, which can be translated to a number of turns in the device being monitored.

Typically, multi-turn sensors comprise a plurality of magnetoresistive elements laid out as a strip in a spiral or closed loop configuration, with one end of the strip being coupled to a domain wall generator. The domain wall generator generates domain walls in response to rotations of an external magnetic field, these domain walls then being injected into the magnetic strip, changing the magnetic domain of each magnetoresistive element as it passes through. As the magnetic domain changes, the resistance of the magnetoresistive elements will also change due to the resulting change in magnetic alignment.

SUMMARY

The present disclosure provides a method of monitoring the magnetic field in which a magnetic sensor is operating in to ensure that the sensor is operating within its defined magnetic window. For example, the method uses the sensor output of either a multi-turn sensor, or some other magnetoresistive sensor that is being used in conjunction with the multi-turn sensor, for example, a magnetic single turn sensor or a second multi-turn sensor, to monitor the operating magnetic field. When using the sensor output of the multi-turn sensor, a reference magnetoresistive element may be implemented that is used to measure the magnetic field and does not contribute to the turn count of the sensor.

In a first aspect, the present disclosure provides a method of monitoring a first magnetic sensor located in proximity to an external magnetic field, the first magnetic sensor having an operating window between a first magnetic field strength and a second magnetic field strength, wherein the method comprises measuring a signal of a further magnetic sensor located in proximity to the external magnetic field, determining a magnetic field strength of the external magnetic field from the measured signal, and determining whether the magnetic field strength of the external magnetic field is within the operating window of the magnetic multi-turn sensor.

As such, the magnetic field strength of an external magnetic field, for example, that generated by a magnet that is part of a rotating mechanical system, can be monitored to determine whether it is within the operating window in which the magnetic sensor will operate without fault. This can be determined from an output of some magnetic sensing device that is located in proximity to the external magnetic field.

The first magnetic sensor may be a magnetic multi-turn sensor, and the further magnetic sensor may be a magnetic single turn sensor. For example, the magnetic single turn sensor may be an anisotropic magnetoresistive (AMR) based single turn sensor, whilst the magnetic multi-turn sensor may be a giant magnetoresistive (GMR) or a tunnel magnetoresistive (TMR) based multi-turn sensor. In such cases, determining the magnetic field strength from the signal of the magnetic single turn sensor comprises measuring a voltage output by the magnetic single turn sensor. A voltage output below a predetermined value is indicative of a magnetic field strength below the first magnetic field strength of the operating window. The voltage output may comprise a sine component and a cosine component, wherein determining the magnetic field strength comprises calculating a radius of the sine component and the cosine component.

The amplitude of an AMR single turn sensor, as well as GMR and TMR based sensors, is also dependent on temperature. In this respect, a temperature coefficient is more or less known for all of these xMR sensors. By measuring the temperature as well as the amplitude, more precise information of the field strength can be determined. In automotive applications, the processing circuit often measures the temperature for diagnostic reasons anyway and so the temperature measurement can be easily incorporated to the measurement of the field strength. In this respect, the voltage supply or current can be increased by a constant factor based on a measured increase in temperature, to thereby attenuate any reduction in sensitivity caused by the temperature rise. For example, if the sensitivity of the single turn sensor is decreased by 1% every 1° C. increase in temperature, then the voltage supply can be increased by 1% every 1° C. to counteract this reduction in sensitivity.

In other arrangements described herein, the further magnetic sensor may be the first magnetic sensor itself. For example, a signal of the magnetic multi-turn sensor is measured to determine the magnetic field strength and determine whether it is within the operating window in which the multi-turn sensor will operate without fault.

For example, determining a magnetic field strength from the signal of the magnetic multi-turn sensor may comprise measuring a resistance change in at least one magnetoresistive element of the magnetic multi-turn sensor.

In such cases, the method may comprise applying a filter to the measured resistance.

In other arrangements, the further magnetic sensor may be a reference sensor.

For example, the reference sensor may be a further magnetic multi-turn sensor. The further magnetic multi-turn sensor may have a further operating window between a third magnetic field strength and a fourth magnetic field strength, the further operating window being different to the operating window of the magnetic multi-turn sensor. In some cases, the operating window of the further magnetic multi-turn sensor and the operating window of the magnetic multi-turn sensor may be overlapping. By an additional magnetic multi-turn sensor with a different operating window, it is possible to detect that the magnetic field strength is too close to either the first or second magnetic field strength based on the behavior of the further magnetic multi-turn sensor. For example, by using two multi-turn sensors with overlapping magnetic windows, any deviation in the measured turn count by either sensor will indicate that the magnetic field strength has gone beyond the operating window at some point.

The further magnetic multi-turn sensor may comprise magnetoresistive elements of a first width, and the magnetic multi-turn sensor may comprise magnetoresistive elements of a second width. By providing the two multi-turn sensors with magnetoresistive elements of a different width, the two sensors are provided with different operating windows.

The magnetic multi-turn sensor may be a giant magnetoresistive (GMR) based multi-turn sensor.

In further arrangements, the reference sensor may be a reference magnetoresistive element.

In this respect, the magnetic multi-turn sensor may comprise a plurality of magnetoresistive elements of a first width, and the reference magnetoresistive element may have a second width. In some cases, the reference magnetoresistive element may be connected to the magnetoresistive elements of the magnetic multi-turn sensor. Determining a magnetic field strength of the external magnetic field may comprise measuring a resistance change in the reference magnetoresistive element.

In a second aspect, the present disclosure provides a device for monitoring a first magnetic sensor located in proximity to an external magnetic field, the first magnetic sensor having an operating window between a first magnetic field strength and a second magnetic field strength, wherein the device is configured to receive a signal of a further magnetic sensor located in proximity to the external magnetic field, determine a magnetic field strength of the external magnetic field from the received signal, and determine whether the magnetic field strength of the external magnetic field is within the operating window of the magnetic multi-turn sensor.

The device may be configured to detect a fault in the first magnetic sensor if the magnetic field strength of the external magnetic field is outside of the operating window. For example, in the case of the first magnetic sensor being a multi-turn sensor, an incorrect turn count may be detected.

The device may comprise a processing circuit in communication with the further magnetic sensor and configured to receive and process the signal of the further magnetic sensor.

The first magnetic sensor may be a magnetic multi-turn sensor, and the further magnetic sensor may be a magnetic single turn sensor, for example, an AMR based single turn sensor and a giant magnetoresistive (GMR) or a tunnel magnetoresistive (TMR) based multi-turn sensor. The device may be configured to determine the magnetic field strength based on a voltage output of the magnetic single turn sensor, wherein a voltage output below a predetermined value is indicative of a magnetic field strength below the first magnetic field strength of the operating window. Additionally, the amplitude of an AMR single turn sensor, as well as GMR and TMR based sensors, is dependent on temperature. In this respect, a temperature coefficient is more or less known for all of these xMR sensors. By measuring the temperature as well as the amplitude, more precise information of the field strength can be determined. In automotive applications, the processing circuit often measures the temperature for diagnostic reasons anyway and so the temperature measurement can be easily incorporated to the measurement of the field strength.

In a third aspect, the present disclosure provides a magnetic sensor system, comprising a first magnetic sensor located in proximity to an external magnetic field, the first magnetic sensor having an operating window between a first magnetic field strength and a second magnetic field strength, and a device configured to receive a signal of a further magnetic sensor located in proximity to the external magnetic field, determine a magnetic field strength of the external magnetic field from the received signal, and determine whether the magnetic field strength of the external magnetic field is within the operating window of the magnetic multi-turn sensor.

The further magnetic sensor located in proximity to the external magnetic field may be a magnetic single turn sensor. In some cases, the system may comprise the magnetic single turn sensor.

The device may be configured to determine the magnetic field strength based on a voltage output of the magnetic single turn sensor, wherein a voltage output below a predetermined value is indicative of a magnetic field strength below the first magnetic field strength of the operating window.

The device may be configured to detect a fault in the first magnetic sensor if the magnetic field strength of the external magnetic field is outside of the operating window. For example, in the case of the first magnetic sensor being a multi-turn sensor, an incorrect turn count may be detected.

The device may comprise a processing circuit in communication with the further magnetic sensor and configured to receive and process the signal of the further magnetic sensor.

The first magnetic sensor may be a magnetic multi-turn sensor, for example, a giant magnetoresistive (GMR) or a tunnel magnetoresistive (TMR) based multi-turn sensor.

In other arrangements, the further magnetic sensor may be a reference sensor such as those described above. For example, the reference sensor may be a further magnetic multi-turn sensor or a reference magnetoresistive element.

In a fourth aspect, the present disclosure provides a method of monitoring a magnetic multi-turn (MT) sensor system comprising a first magnetic multi-turn sensor and a second magnetic multi-turn sensor, wherein the magnetic multi-turn (MT) sensor system is located in proximity to an external magnetic field, and wherein the method comprises: measuring a first signal of the first magnetic multi-turn sensor, the first magnetic multi-turn sensor having a first operating window between a first magnetic field strength and a second magnetic field strength; measuring a second signal of the second magnetic multi-turn sensor, the second magnetic multi-turn sensor having a second operating window between a third magnetic field strength and a fourth magnetic field strength, wherein the second operating window overlaps with the first operating window; detecting a change in a magnetic field strength of the external magnetic field based on the first and second measured signals.

A deviation in the magnetic field strength of the external magnetic field beyond the first or second operating window may be detected if the first signal is different to the second signal.

In a fifth aspect, the present disclosure provides a device for monitoring a magnetic multi-turn (MT) sensor system comprising a first magnetic multi-turn sensor and a second magnetic multi-turn sensor, wherein the magnetic multi-turn (MT) sensor system is located in proximity to an external magnetic field, wherein the device is configured to perform a method in accordance with the above fourth aspect.

In a sixth aspect, the present disclosure provides a magnetic multi-turn sensor system, comprising: a first magnetic multi-turn sensor, the first magnetic multi-turn sensor having a first operating window between a first magnetic field strength and a second magnetic field strength; a second magnetic multi-turn sensor, the second magnetic multi-turn sensor having a second operating window between a third magnetic field strength and a fourth magnetic field strength, wherein the second operating window overlaps with the first operating window and a device according to the fifth aspect.

BRIEF DESCRIPTION OF THE DRAWINGS

The present disclosure will now be described by way of example only with reference to the accompanying drawings in which.

DETAIL DESCRIPTION

Magnetic multi-turn sensors can be used to monitor the turn count of a rotating shaft coupled to a magnet. Such magnetic sensing can be applied to a variety of different applications, such as automotive applications, medical applications, industrial control applications, consumer applications, and a host of other applications which use information regarding a position of a rotating component.

Typically, multi-turn sensors comprise a plurality of magnetoresistive elements laid out as a strip in a spiral or closed loop configuration. Multi-turn sensors based on controlled domain wall propagation in a spiral or closed loop system operate in a defined magnetic window. The magnetic window can be defined by a minimum magnetic flux density, Bmin, and a maximum magnetic flux density, Bmax. Below Bmin, domain wall propagation can fail, causing the turn count information to be corrupted. Above Bmax, the domain walls can be nucleated prematurely, so that the sensor will contain false turn count information. Consequently, it is important that the senor stays within the magnetic window between Bmin and Bmax in order to provide accurate turn count information.

The present disclosure therefore provides a method of monitoring the magnetic field in which a multi-turn sensor is operating in order to ensure that the multi-turn sensor is operating within its defined magnetic window. Specifically, the method uses the sensor outputs of either of the multi-turn sensor itself, or another magnetic sensor being used in conjunction with the multi-turn sensor, such as a single turn sensor or a further multi-turn sensor, to determine whether the magnetic field sits within the magnetic window of the multi-turn sensor, that is, between Bmin and Bmax. The multi-turn sensor may also implement a reference resistor, for example, by comparing the output of one resistor to all of the other resistors within the sensor spiral.

Figure 1:
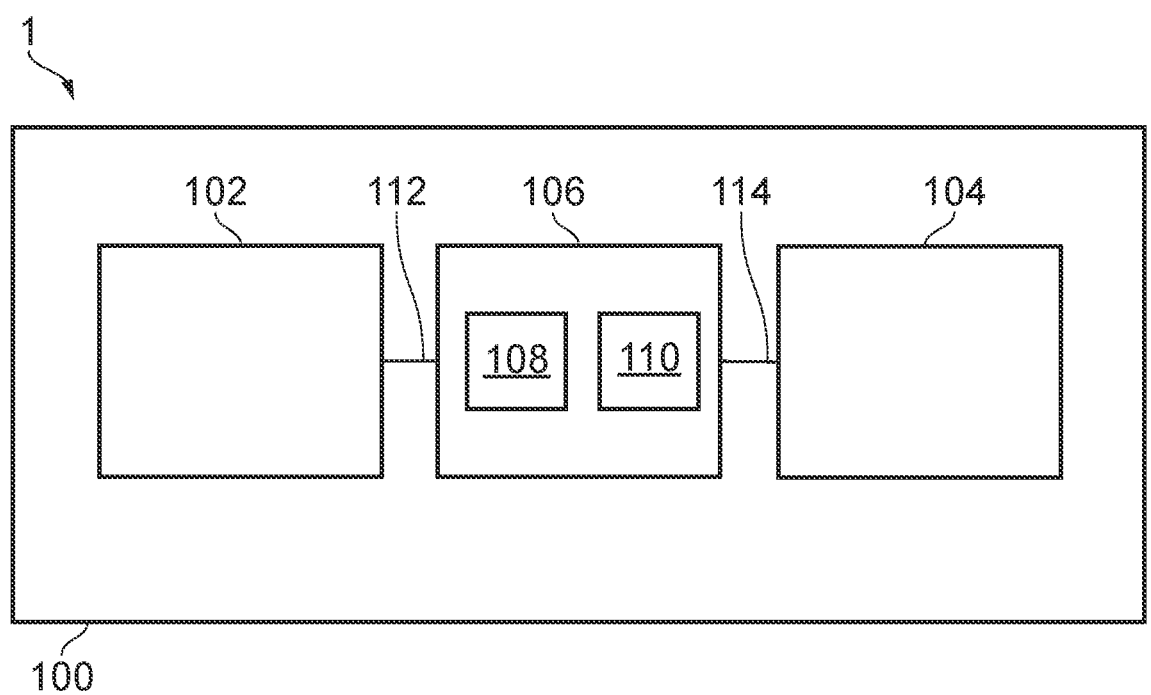
FIG. 1 is a schematic top view of a multi-turn sensor and a single turn sensor in accordance with an embodiment of the disclosure.

FIG. 1 illustrates a schematic block diagram of an example magnetic sensor system 1 that includes a multi-turn (MT) sensor 102, and which may be used to implement the methods described herein. The magnetic multi-turn sensor system 1 also includes a single turn (ST) sensor 104, although it will be appreciated that the magnetic sensor system 1 may be implemented without the ST sensor 104 or with a different type of magnetic sensor, for example, a second magnetic multi-turn sensor, as will be described in more detail below.

The system 1 also comprises a processing circuit 106, and an integrated circuit 100 on which the MT sensor 102, the ST sensor 104 and processing circuit 106 are disposed. The processing circuit 106 receives signals $S_{MT}$ 112 from the MT sensor 102 and processes the received signals to determine that the turn count using a turn count decoder 108, which will output a turn count representative of the number of turns of an external magnetic field (not shown) rotating in the vicinity of the MT sensor 102. Similarly, the processing circuit 106 may also receive signals $S_{ST}$ 114 from the ST sensor 104 and process the received signals using a position decoder 110 to output an angular position of the external magnetic field. As will be discussed in more detail below, both the turn count decoder 108 and the position decoder 110 may be configured to measure the magnetic field in which the multi-turn sensor system 1 is operating.

In one embodiment, the ST sensor 104, which may be an anisotropic magnetoresistive (AMR), giant magnetoresistive (GMR) or tunnel magnetoresistive (TMR) based position sensor, has an output signal 114 that is field dependent. That is to say, the output signal 114 is indicative of the magnetic field strength and any variations in the amplitude of the magnetic field will cause a proportional change in the amplitude of the output signal 114. Consequently, the output signal 114 of the ST sensor 104 can be used to detect if the magnetic field falls below the lower limit of the magnetic operating window, Bmin, of the MT sensor 102.

Figure 2A:
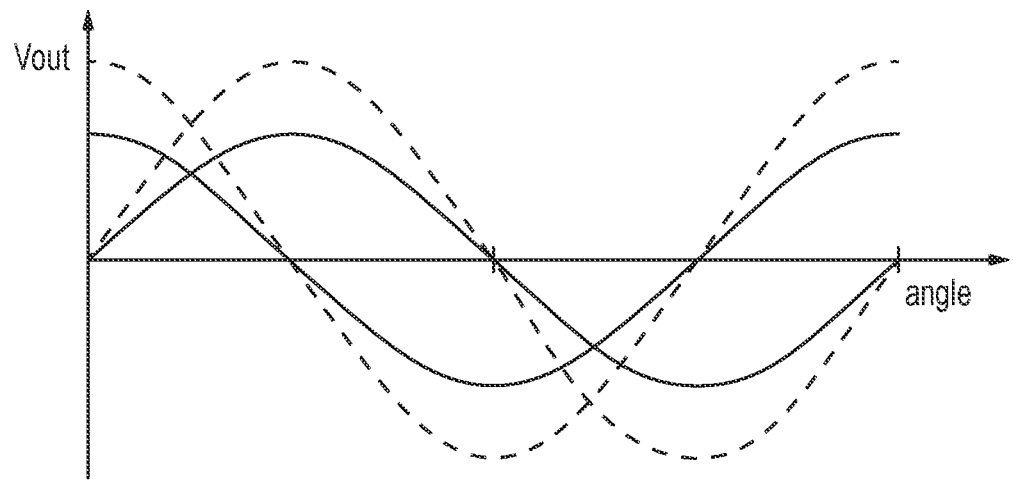
FIGS. 2A and 2B are graphs illustrating a sensor output in an embodiment of the disclosure.
Figure 2B:
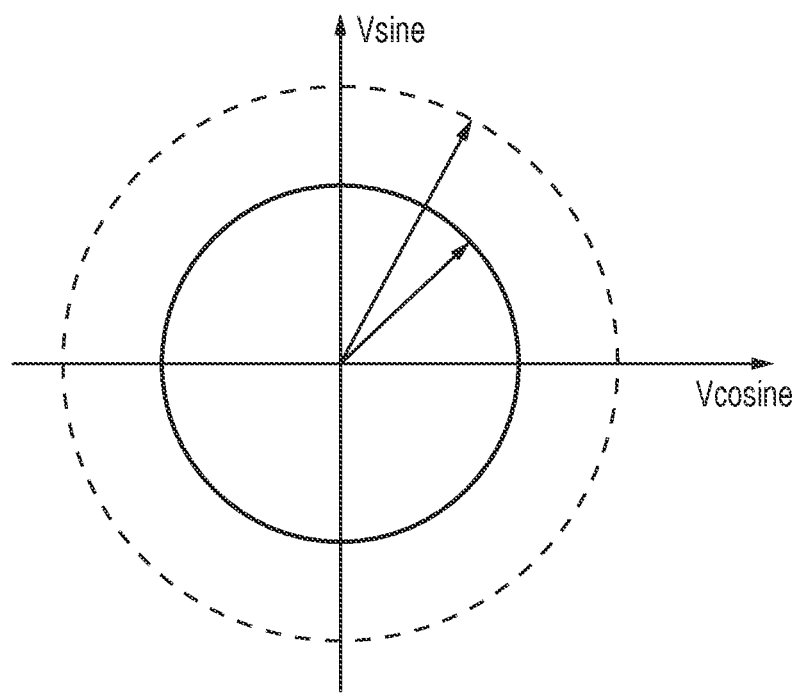

An example is provided by FIGS. 2A and 2B, which illustrate the output signal of an AMR based ST sensor 104, in the case of a magnetic field that is strong enough to saturate the magnetoresistive elements (i.e. the point at which the output signal of the ST sensor is indicative of magnetic field angle and does not vary with field strength), and in the case of the magnetic field strength dropping below saturation. The output signal 114 of the ST sensor 104 is a voltage measurement having a sine and cosine component. In FIG. 2A, the sine and cosine signals of the ST sensor 104 in saturation as the magnetic field rotates are shown by the dashed lines, whilst the sine and cosine signals when the magnetic field drops below saturation are shown by the solid lines. As such, as the magnetic field drops below the strength required to saturate the magnetoresistive elements of the ST sensor 104, the amplitude of the output signal 114 decreases. More precisely, as shown in FIG. 2B, the radius of the sine and cosine signals can be used to measure the magnetic field and determine whether it has dropped below Bmin, using the following equation:

$$\vec{B} = \sqrt{V_{Sine}^2 + V_{Cosine}^2} \quad [1]$$

As such, the output signals 114 from the ST sensor 104 can be processed by the position decoder 110, or some other part of the processing circuit 106, to determine whether the magnetic field has dropped below the lower limit, Bmin, of the magnetic operating window of the MT sensor 102. If the magnetic field strength has dropped below Bmin, then the turn count of the MT sensor 102 can be considered to be incorrect. The output signals 114 from the ST sensor 104 can thus be continuously monitored to monitor the strength of the magnet field being measured, and thereby detect any change or disruption to the system that will result in a false turn count.

Additionally, the amplitude of the ST sensor 104 is dependent on temperature. In this respect, a temperature coefficient is more or less known for the ST sensor 104. By measuring the temperature as well as the amplitude, more precise information of the field strength can also be determined. For example, based on the measured temperature, the voltage input to the ST sensor 104 can be increased accordingly. In this respect, the output signal of an AMR based ST sensor 104 will change by about −0.35%/° C. The amplitude of output of the ST sensor 104 is also dependent on the supply voltage, the output typically being around 13 mV/V in saturated mode (i.e. the magnetoresistive material is saturated). That is to say, at a supply voltage of 1V, the ST sensor has a maximum output of 13 mV, and at a supply voltage of 2V, the ST sensor has a maximum output of 26 mv. By generating a temperature dependent sensor voltage supply, a temperature independent output voltage can be achieved. That is to say, by adjusting the voltage supply as the temperature changes, any variations in the output voltage caused by temperature change can be counteracted. When the amplitude is temperature controlled like this, any field dependent changes in the amplitude can be filtered out to determine the field strength independent of any changes in temperature.

In automotive applications, the processing circuit 106 is often configured to measure the temperature for diagnostic reasons and so the temperature measurement can be easily incorporated to the measurement of the field strength. In this respect, the processing circuit 106 may be in communication with a separate temperature sensor (not shown), which may be disposed on the integrated circuit 100. Alternatively, since a temperature coefficient is more or less known for xMR sensors, the amplitude of the MT sensor 102 signal, as an example, could be used to measure changes in temperature.

Figure 5:
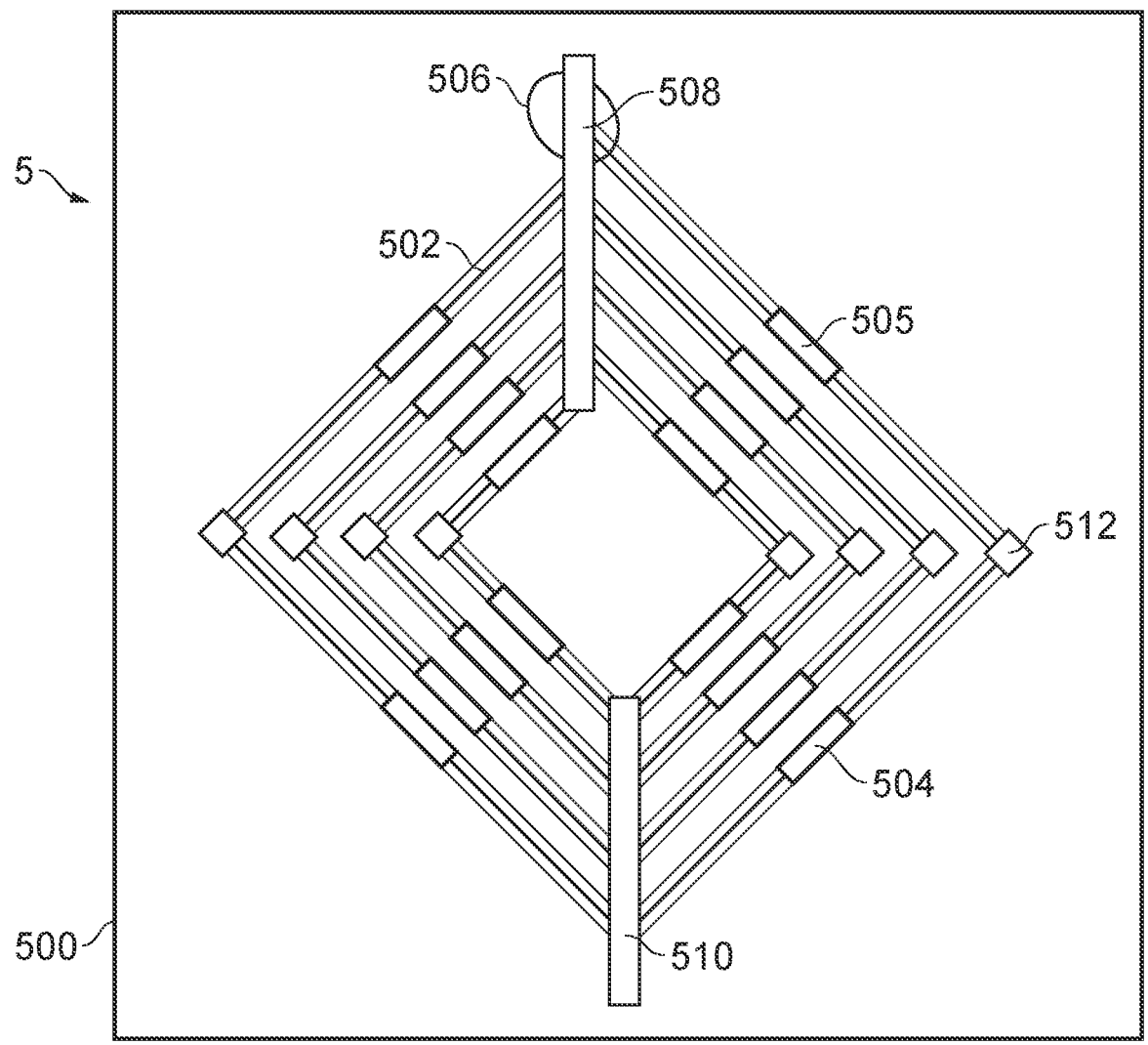
FIG. 5 is an example of a magnetic multi-turn sensor in accordance with embodiments of the disclosure.

In another embodiment, the sensor signals 112 from the MT sensor 102 may be used to derive information about the magnetic field strength. In such cases, it will be appreciated that the magnetic sensing system 1 may or may not include the single turn sensor 104. FIG. 5 shows an example of a magnetic strip 502 layout representation of a magnetic multi-turn sensor 5, shown here on an integrated circuit 500, which may provide the MT sensor 102 shown in FIG. 1 for use in any of the embodiments described herein.

In FIG. 5, the magnetic strip 502 comprises a plurality of magnetoresistive elements 504, preferably, GMR based magnetoresistive elements, or alternatively, TMR based magnetoresistive elements. In this example, the magnetic strip 502 is a GMR based magnetoresistive track that is physically laid out in a spiral configuration. As such, the magnetic strip 502 has a plurality of segments formed of magnetoresistive elements 504 arranged in series with each other. The magnetoresistive elements 504 act as variable resisters that change resistance in response to a magnetic alignment state. The end of the magnetic strip 502 is coupled to a domain wall generator (DWG) 506, and it will be appreciated that the DWG 506 may be coupled to either end of the magnetic strip 502. The DWG 506 generates domain walls in response to rotations in an external magnetic field, or the application of some other strong external magnetic field the operating magnetic window of the sensor 5. These domain walls are then injected into the magnetic strip 502 and as the magnetic domain changes, the resistance of the magnetoresistive elements 504 will also change due to the resulting change in magnetic alignment.

In order to measure the varying resistance of the magnetoresistive elements 504 as domain walls are generated, the magnetic strip 502 is electrically connected to a supply voltage VDD 508 and to ground GND 510 to apply a voltage between a pair of opposite corners. The corners halfway between the voltage supplies are provided with electrical connections 512 so as to provide half bridge outputs. As such, the multi-turn sensor 5 comprises multiple Wheatstone bridge circuits, with each half bridge 512 corresponding to one half turn or 180 degree rotation of an external magnetic field. Measurements of voltage at the electrical connections 512 can thus be used to measure changes in the resistance of the magnetoresistive elements 504, which can thus be used to determine the number of turns in the magnetic field, for example, by outputting the voltage measurements to the turn count decoder 108.

The example shown in FIG. 5 comprises 4 spiral windings and 8 half bridges 512, and is thus configured to count four full turns of an external magnetic field. However, it will be appreciated that a multi-turn sensor may have any number of spiral windings depending on the number of magnetoresistive elements 504. In general, multi-turn sensors can count as many turns as spiral windings. It will also be appreciated that the magnetoresistive elements 504 may be electrically connected in any suitable way so as to provide a sensor output representative of the changes in magnetic alignment state. For example, the magnetoresistive elements 504 may be connected in a matrix arrangement such as that described in US 2017/0261345, which is hereby incorporated by reference in its entirety. As a further alternative, each magnetoresistive segment may be connected individually, rather than in a bridge arrangement.

Figure 3:
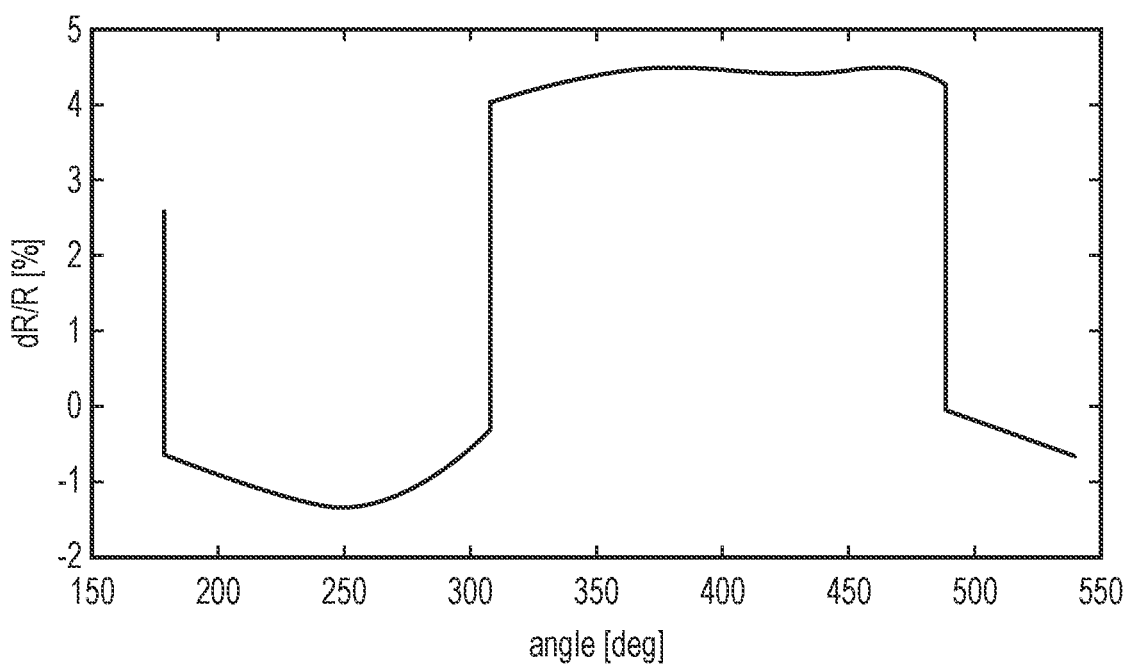
FIG. 3 is a graph illustrating a sensor output in an embodiment of the disclosure.

The change in resistance measured at one of the magnetoresistive elements 504 can also be used to determine whether the external magnetic field strength is within the defined operating window of the MT sensor 5. FIG. 3 illustrates how the resistance of a single magnetoresistive element 504 in a multi-turn spiral changes as the magnetic field angle changes. The resistance of the magnetoresistive element 504 changes rapidly at 175 degrees, 310 degrees and 490 degrees. At those transition points, a domain wall is passing through the strip 502 changing the resistance of the magnetoresistive element 504 so that it changes between a high and low resistance reading.

Figure 4A:
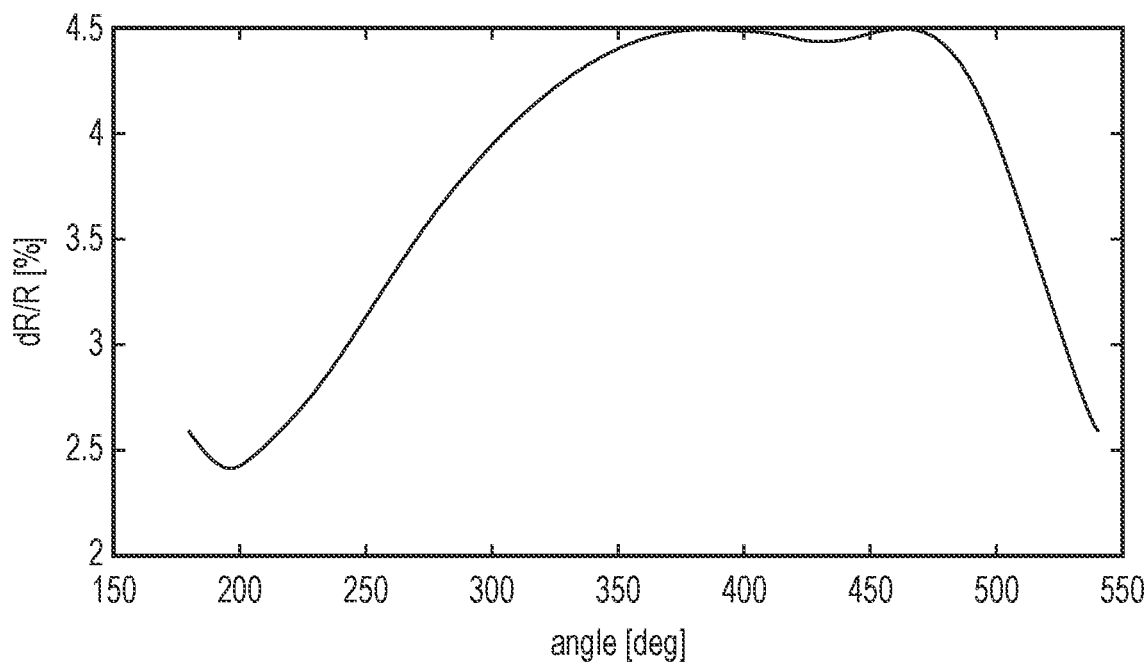
FIGS. 4A-4B are graphs illustrating a sensor output in an embodiment of the disclosure.
Figure 4B:
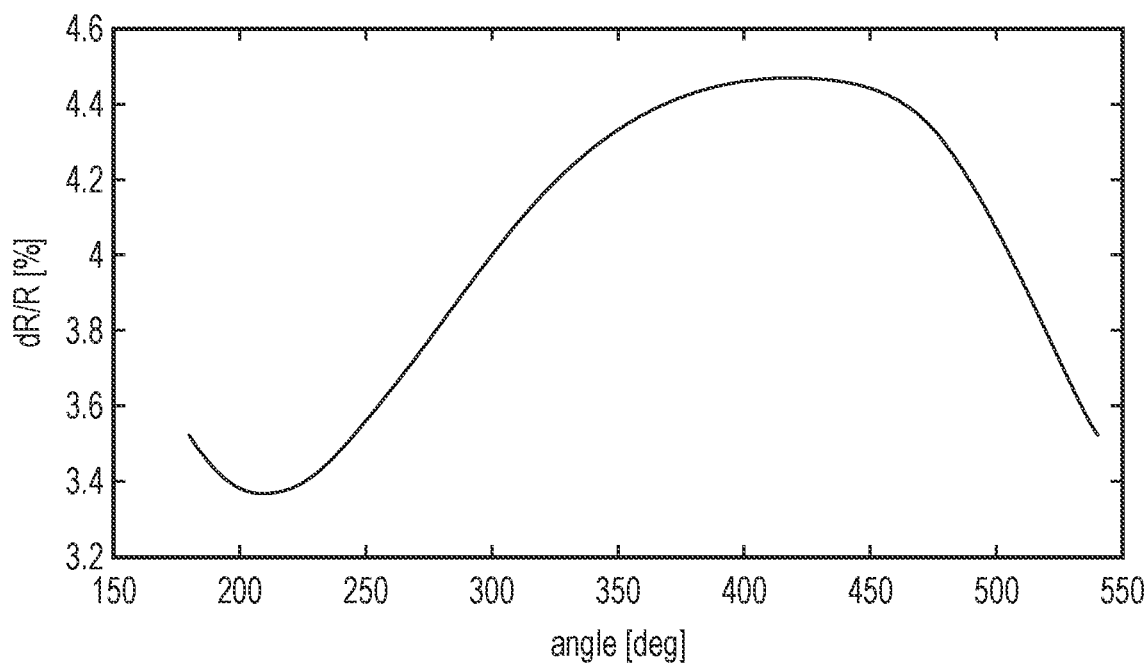

However, the resistance of the magnetoresistive element 504 is also changing due to both a GMR and AMR effect, and therefore changes with varying magnetic field strength, illustrated by FIGS. 4A and 4B. FIG. 4A shows the resistance change of the magnetoresistive element 504 in the case where there are no domain walls passing through the magnetic strip 502 and when the magnetic field strength is 31 mT. As such, the portion of the overall resistance change that is due to the domain wall passing through has been removed. Whilst the change is resistance is much lower to that when domain walls are propagating through the magnetic strip 502, the remaining portion of the resistance change is very dependent on the magnetic field strength. The amplitude of this portion of the resistance change is therefore very low for lower magnetic fields and very high for higher magnetic fields. For example, as shown in FIG. 4B, the magnetic field strength has been reduced to 19 mT, and thus the resistance change is significantly lower.

As such, the portion of the resistance change that is due to the domain wall propagation can be filtered out, for example, using a suitable bandpass filter, in order to get the resistance change that is due to magnetic field strength only. When used in combination with a single turn sensor, it is possible to collect resistance and/or voltage data each 5° rotation of the magnetic field and perform an angle based Fast Fourier transform (FFT) after N rotations. The GMR and AMR portion of the resistance change can thus be filtered out and the resulting signal used to determine the field strength. The amplitude and the form of the output signal 112 of the MT sensor 5 can thus be processed to determine the magnetic field strength, which in turn can be used to determine whether the sensor is operating within the defined magnetic window. It will be appreciated that the resistance change of the whole spiral or a single magnetoresistive element within the spiral may be used to measure the magnetic field strength. If the magnetic field strength has dropped below Bmin or gone above Bmax, then the turn count of the MT sensor 5 can be considered to be incorrect. Conversely, if the magnetic field strength is within the operating window, then the turn count can be considered accurate.

In the case of TMR based magnetoresistive elements 504, the resistance of the elements 504 would be changing due to the TMR effect, with no AMR effect on the signal. However, the amplitude of the output signal 112 would still be dependent on the magnetic field strength, and can thus be used to determine whether the sensor is operating within the defined magnetic window.

Using the principles described above with reference to FIGS. 3 to 5, a reference magnetoresistive element may be implemented in other embodiments to measure the magnetic field strength of the external magnetic field. In one embodiment, the reference magnetoresistive element is separate from the MT sensor 102 such that it does not have any domain walls propagating through it. Consequently, the output signal of the reference magnetoresistive element will be the pure GMR/AMR signal, and thus the resistance change of that reference magnetoresistive element can be used to measure the magnetic field strength without the need for any filtering. It will however be appreciated that the reference magnetoresistive element may also be implemented in conjunction with a domain wall generator in order to get clear defined switching between the high and low resistance measurements.

The reference magnetoresistive element may be identical to those used in the sensor (and thus have the same magnetic operating window as the MT sensor 102), or it may have a narrower or wider track width such that it has a different operating window. For example, the reference magnetoresistive element may have a wider track width such that its resistance would switch between a high and low resistance at magnetic field that is below but very close to the Bmax of the MT sensor 102, thus indicating that the magnetic field is very close to the upper limit of the operating window of the MT sensor 120. A reference magnetoresistive element having an even wider track width could then be used to monitor the lower limit, Bmin, of the operating window. Here the resistance of the reference magnetoresistive element would switch constantly between a high and low resistance for magnetic fields above Bmin, but would stop switching if the magnetic field strength dropped below Bmin.

It will also be appreciated that the magnetic window of the reference magnetoresistive element may also be altered in other ways, for example, by changing the dimensions and/or material of the free layer of the reference magnetoresistive element, the free layer being that within the stack of layers that make up a magnetoresistive element which changes its magnetization alignment state in response to an externally applied magnetic field.

In another embodiment, the MT sensor, such as the spiral shown in FIG. 5, may include a reference magnetoresistive element 505 as described above, wherein the resistance measured at this reference magnetoresistive element 505 is also used to monitor the magnetic field strength.

Figure 6:
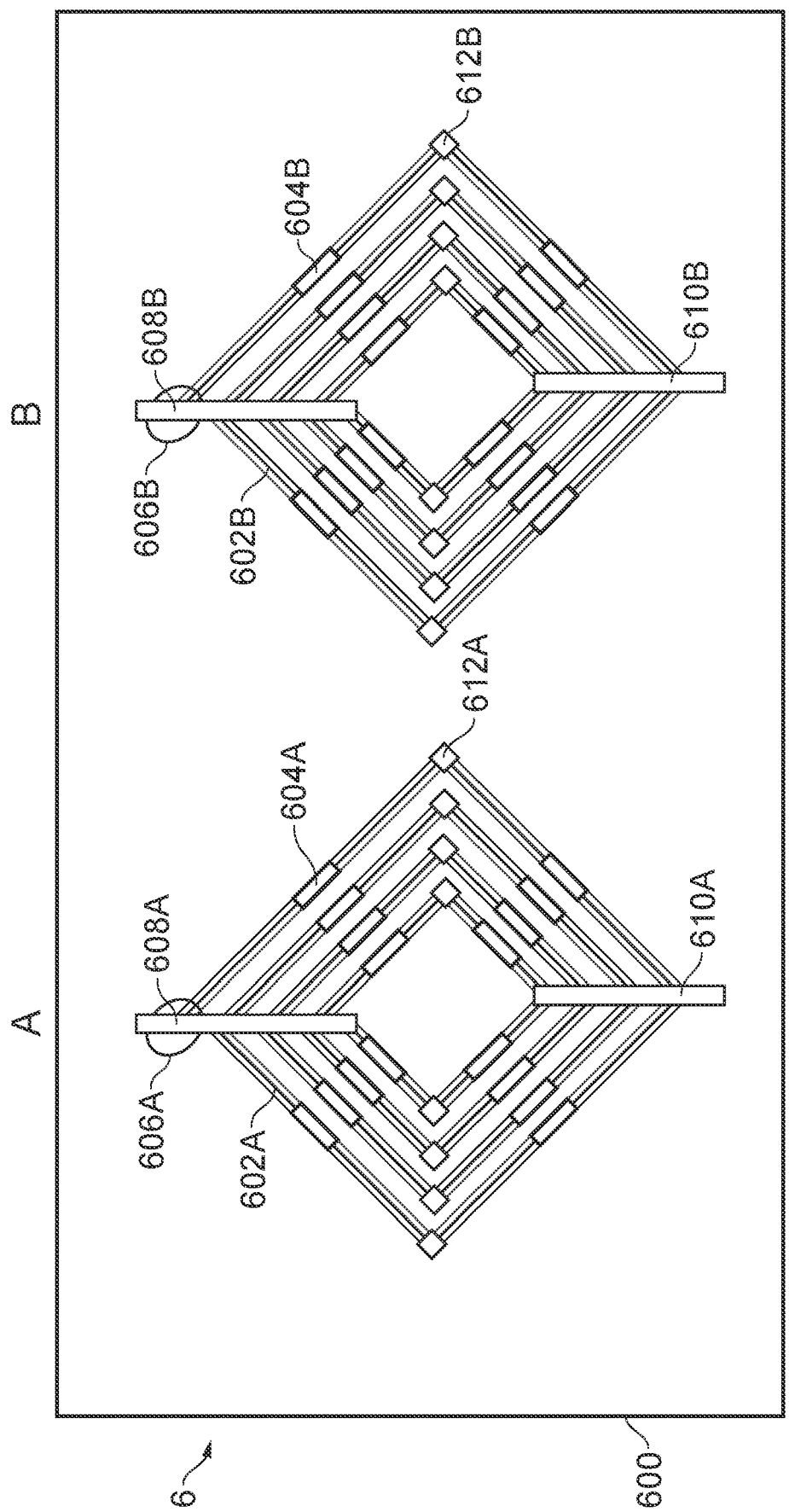
FIG. 6 is a magnetic multi-turn system comprising two magnetic multi-turn sensors in accordance with an embodiment of the disclosure.

In a further embodiment, as shown in FIG. 6, a multi-turn sensor system 6 comprising a first MT sensor A and a second MT sensor B, shown here on an integrated circuit 600, may be used to monitor the magnetic field strength. It will be appreciated that the multi-turn sensor system 6 may be used in place of the MT sensor 102 shown in FIG. 1. In this example, each of the MT sensors A, B have substantially the same spiral layout as the magnetic strip shown in FIG. 5, each comprising a plurality of magnetoresistive elements 604A, 604B connected in series in a spiral strip 602A, 602B layout. Each magnetic strip 602A, 602B is connected to a supply voltage 508A, 508B and to ground 610A, 610B, with electrical connections 612A, 612B at the corners half way between the voltage supplies to provide half bridge outputs. The ends of the magnetic strips 602A, 602B are also connected to a DWG 606A, 606B for generating domain walls in response to rotations in an external magnetic field.

In one example, the first MT sensor A is used solely for counting the turn count of the external magnetic field, whilst the second MT sensor B is used as a reference spiral for monitoring the magnetic field strength. In such cases, the second MT sensor B may comprise magnetoresistive elements 604B that have a wider or narrower track width such that the magnetic operating window of the MT sensor B is different to that first MT sensor A. In doing so, as described above, the magnetoresistive elements 604b of the second MT sensor B operate very close to the Bmin and Bmax of the first MT sensor A, such that their resistance will either start or stop switching between high and low resistance if the magnetic field strength goes beyond the operating window of the first MT sensor A in either direction.

In another example, both the first MT sensor A and the second MT sensor B are used for counting the number of turns, with the first and second MT sensors having different but overlapping magnetic operating windows. For example, if the magnetic sensor system operates for magnetic fields between 15 mT and 35 mT, then the first MT sensor A could be designed to have a magnetic window of 10 mT to 35 mT, while the second MT sensor B could cover the range 15 mT to 40 mT. In the normal operating range of 15 mT to 35 mT both spirals will operate correctly, and consequently both will output the same turn count. If the magnetic field drops below 15 mT, then the first MT sensor A will continue to operate correctly and output an accurate turn count, while the second MT sensor B will stop operating reliably since the magnetic field is below the Bmin. In such cases, domain walls are likely to get pinned along the track of the second sensor B and then annihilated by other domain walls passing by, thus resulting a false turn count. From that point in time onwards, there will be a difference in the readings of the two MT sensors, which can be detected as a fault in the second MT sensor B as a result of the change in magnetic field strength. Consequently, the output of the first MT sensor A can continue to be used to count the number of turns, whilst the output of the second MT sensor B can be ignored. Similarly, if the field increases above 35 mT, then the second MT sensor B will continue to count correctly, while the first MT sensor A will be corrupted due to nucleated domain walls, the output of which should therefore be disregarded.

This is particularly useful in cases where the magnetic field strength has temporarily deviated outside of the magnetic operating window at a time where the MT sensor (or ST sensor) output was not being measured, and then returned to within the magnetic window by the time the sensor output is being measured. In such cases, the output of the MT sensor have become corrupted without being detected. Therefore, by using two MT sensors with overlapping magnetic windows, any deviation in the measured turn count by either sensor will indicate that the magnetic field strength has gone beyond the operating window at some point.

Whilst the above provides methods of monitoring the magnetic field in which a multi-turn sensor is operating in order to ensure that the multi-turn sensor is operating within its defined magnetic window, it will be appreciated that the methods may also be applied to other magnetic sensors that have a defined operating window, for example, a Hall sensor, TMR angle sensor or dual-axis TMR field sensor.

Applications

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure.

The invention claimed is:

1. A method of monitoring a magnetic sensor system comprising a first magnetic sensor and a second magnetic sensor located in proximity to an external magnetic field and configured to detect turn count of an object based at least in part on the external magnetic field, the magnetic sensor system having an operating window between a first magnetic field strength and a second magnetic field strength, wherein the method comprises:
    measuring a signal of the second magnetic sensor located in proximity to the external magnetic field;
    determining a magnetic field strength of the external magnetic field from the measured signal;
    determining whether the magnetic field strength of the external magnetic field is within the operating window of the first magnetic sensor;
    determining, when the magnetic field strength of the external magnetic field is below the first magnetic field strength, that the first magnetic sensor operates correctly and the second magnetic sensor stops operating reliably; and
    determining, when the magnetic field strength of the external magnetic field is above the second magnetic field strength, that the second magnetic sensor operates correctly and the first magnetic sensor stops operating reliably.

2. A method according to claim 1, wherein the first magnetic sensor is a magnetic multi-turn sensor, and the second magnetic sensor is a magnetic single turn sensor.

3. A method according to claim 2, wherein determining the magnetic field strength from the signal of the magnetic single turn sensor comprises measuring a voltage output by the magnetic single turn sensor.

4. A method according to claim 3, wherein a voltage output below a predetermined value is indicative of a magnetic field strength below the first magnetic field strength of the operating window.

5. A method according to claim 3, wherein the voltage output comprises a sine component and a cosine component, and wherein determining the magnetic field strength comprises calculating a radius of the sine component and the cosine component.

6. A method according to claim 2, wherein the magnetic single turn sensor is an anisotropic magnetoresistive (AMR) based single turn sensor.

7. A device for monitoring a magnetic sensor system comprising a first magnetic sensor and a second magnetic sensor located in proximity to an external magnetic field and configured to detect turn count of an object based at least in part on the external magnetic field, the magnetic sensor system having an operating window between a first magnetic field strength and a second magnetic field strength, wherein the device is configured to:
- receive a signal of the second magnetic sensor located in proximity to the external magnetic field;
- determine a magnetic field strength of the external magnetic field from the received signal;
- determine whether the magnetic field strength of the external magnetic field is within the operating window of the first magnetic sensor;
- determining, when the magnetic field strength of the external magnetic field is below the first magnetic field strength, that the first magnetic sensor operates correctly and the second magnetic sensor stops operating reliably; and
- determining, when the magnetic field strength of the external magnetic field is above the second magnetic field strength, that the second magnetic sensor operates correctly and the first magnetic sensor stops operating reliably.

8. A device according to claim 7, wherein the device is configured to detect a fault in the first magnetic sensor if the magnetic field strength of the external magnetic field is outside of the operating window.

9. A device according to claim 7, wherein the device comprises a processing circuit in communication with the second magnetic sensor and configured to receive and process the signal of the second magnetic sensor.

10. A device according to claim 7, wherein the first magnetic sensor is a magnetic multi-turn sensor, and the second magnetic sensor is a magnetic single turn sensor.

11. A device according to claim 10, wherein the device is configured to determine the magnetic field strength based on a voltage output of the magnetic single turn sensor.

12. A device according to claim 11, wherein a voltage output below a predetermined value is indicative of a magnetic field strength below the first magnetic field strength of the operating window.

13. A magnetic sensor system, comprising:
- a first magnetic sensor located in proximity to an external magnetic field and configured to detect turn count of an object based at least in part on the external magnetic field, the magnetic sensor system having an operating window between a first magnetic field strength and a second magnetic field strength; and
- a device configured to:
  - receive a signal of a second magnetic sensor located in proximity to the external magnetic field;
  - determine a magnetic field strength of the external magnetic field from the received signal;
  - determine whether the magnetic field strength of the external magnetic field is within the operating window of the first magnetic sensor;
  - determine, when the magnetic field strength of the external magnetic field is below the first magnetic field strength, that the first magnetic sensor operates correctly and the second magnetic sensor stops operating reliably; and
  - determine, when the magnetic field strength of the external magnetic field is above the second magnetic field strength, that the second magnetic sensor operates correctly and the first magnetic sensor stops operating reliably.

14. A system according to claim 13, wherein the second magnetic sensor located in proximity to the external magnetic field is a magnetic single turn sensor.

15. A system according to claim 14, wherein the system second comprises the magnetic single turn sensor.

16. A system according to claim 14, wherein the device is configured to determine the magnetic field strength based on a voltage output of the magnetic single turn sensor.

17. A system according to claim 16, wherein a voltage output below a predetermined value is indicative of a magnetic field strength below the first magnetic field strength of the operating window.

18. A system according to claim 13, wherein the device is configured to detect a fault in the first magnetic sensor if the magnetic field strength of the external magnetic field is outside of the operating window.

19. A system according to claim 13, wherein the device comprises a processing circuit in communication with the second magnetic sensor and configured to receive and process the signal of the second magnetic sensor.

20. A system according to claim 13, wherein the first magnetic sensor and the second magnetic sensor are located on separate areas on a single die.

* * * * *